United States Patent
Chin et al.

[11] Patent Number: 5,952,156
[45] Date of Patent: *Sep. 14, 1999

[54] ENHANCED REFLECTIVITY COATING (ERC) FOR NARROW APERTURE WIDTH CONTACT AND INTERCONNECTION LITHOGRAPHY

[75] Inventors: Arthur Chin, Taipei; Sen-Huan Huang, Tainan; Erik S. Jeng, Taipei, all of Taiwan

[73] Assignee: Vanguard International Semiconductor Corporation, Hsin-Chu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 08/893,640

[22] Filed: Jul. 11, 1997

[51] Int. Cl.$^6$ ........................................................ G03F 7/00
[52] U.S. Cl. .......................... 430/316; 430/313; 430/318
[58] Field of Search ..................................... 430/313, 316, 430/317, 318, 395

[56] References Cited

U.S. PATENT DOCUMENTS

| | | | |
|---|---|---|---|
| 4,379,833 | 4/1983 | Canavello et al. | 430/395 |
| 4,978,420 | 12/1990 | Bach | 430/317 |
| 5,190,894 | 3/1993 | Taneda et al. | 430/318 |
| 5,286,608 | 2/1994 | Koh | 430/313 |
| 5,310,622 | 5/1994 | Sardella | 430/313 |
| 5,332,653 | 7/1994 | Cullen et al. | 430/395 |
| 5,658,830 | 8/1997 | Jeng | 438/620 |
| 5,702,869 | 12/1997 | Chien | 430/313 |
| 5,726,102 | 3/1998 | Lo | 430/318 |

*Primary Examiner*—Kathleen Duda
*Attorney, Agent, or Firm*—George O. Saile; Stephen B. Ackerman; Alek P. Szecsy

[57] ABSTRACT

A method for forming for use within an integrated circuit a narrow aperture width patterned positive photoresist layer from a blanket positive photoresist layer. There is first formed over a semiconductor substrate a reflective layer. There is then formed upon the reflective layer a blanket positive photoresist layer. There is then photoexposed through a reticle the blanket positive photoresist layer to form a photoexposed blanket positive photoresist layer. Finally, the photoexposed blanket positive photoresist layer is developed to form a narrow aperture width patterned positive photoresist layer. The narrow aperture width patterned positive photoresist layer may then be employed as a narrow aperture width patterned positive photoresist etch mask layer in patterning a narrow aperture width patterned reflective layer from the reflective layer. In addition, at least the narrow aperture width patterned reflective layer may then be employed in forming an aperture at least partially through a substrate layer formed beneath the reflective layer. Typically, the aperture will be a contact or interconnection via completely through an insulator layer formed beneath the reflective layer. The method reduces the photoexposure energy and compensates for depth of focus limitations in forming the narrow aperture width patterned positive photoresist layer from the blanket positive photoresist layer.

16 Claims, 4 Drawing Sheets

FIG. 6 ns at least partially through substrate layers within integrated circuits. More particularly, the present invention relates to a method for forming a narrow aperture width patterned positive photoresist layer which may be employed as a positive photoresist etch mask layer in forming a narrow aperture width contact or interconnection via through an insulator layer within an integrated circuit.

ENHANCED REFLECTIVITY COATING (ERC) FOR NARROW APERTURE WIDTH CONTACT AND INTERCONNECTION LITHOGRAPHY

BACKGROUND OF THE INVENTION

1. Field of the Invention

The present invention relates generally to methods for forming apertures at least partially through substrate layers within integrated circuits. More particularly, the present invention relates to a method for forming a narrow aperture width patterned positive photoresist layer which may be employed as a positive photoresist etch mask layer in forming a narrow aperture width contact or interconnection via through an insulator layer within an integrated circuit.

2. Description of the Related Art

Integrated circuits are formed from semiconductor substrate within and upon whose surfaces are formed resistors, transistors, diodes and other electrical circuit elements. The electrical circuit elements are connected internally and externally to the semiconductor substrate upon which they are formed through patterned conductor layers which are separated by insulator layers.

As integrated circuit technology has advanced, and the dimensions of electrical circuit elements within integrated circuits have decreased, it has become increasingly important within those advanced integrated circuits to form through insulator layers within those advanced integrated circuits narrow aperture width contact and interconnection vias of commensurately smaller dimensions to make electrical circuit connections to the electrical circuit elements of decreased dimensions. Typically, narrow aperture width contact and interconnection vias through insulator layers within advanced integrated circuits are formed to the most narrow of narrow aperture dimensions and tolerances employed within advanced integrated circuits. Since narrow aperture width contact and interconnection vias through insulator layers within advanced integrated circuits are formed to the most narrow aperture dimensions and tolerances, it is common in the art that those narrow aperture width contact and interconnection vias are of ten formed only with difficulty. The difficulty in forming narrow aperture width contact and interconnection vias of the most narrow aperture dimensions and tolerances within advanced integrated circuits typically derives from corresponding difficulties in forming a narrow aperture width patterned positive photoresist etch mask layer upon the surface of the insulator layer through which the narrow aperture width contact or interconnection via is desired to be formed.

Among the difficulties included in forming a narrow aperture width patterned positive photoresist etch mask layer upon an insulator layer where the narrow aperture width patterned positive photoresist etch mask layer is employed in forming a narrow aperture width contact or interconnection via through the insulator layer are included: (1) the additional photoexposure energy typically needed to fully photoexpose the portion of a blanket positive photoresist layer which defines the aperture width of the narrow aperture width patterned positive photoresist etch mask layer, particularly when the aperture width is exceedingly narrow (ie: less than about 0.4 microns); and (2) and the inherently reduced depth of focus typically encountered when forming from the blanket positive photoresist layer the narrow aperture width patterned positive photoresist etch mask layer, also particularly when the aperture width is exceedingly narrow (ie: less than about 0.4 microns).

The difficulty relating to the additional photoexposure energy is typically addressed by extending the photoexposure time when forming a narrow aperture width patterned positive photoresist etch mask layer from a blanket positive photoresist layer. Unfortunately, extended photoexposure times often significantly decrease manufacturing efficiency, throughput and economy. The difficulty relating to the inherently reduced depth of focus is often, although not exclusively, compensated by decreasing the thickness of the blanket positive photoresist layer employed in forming the narrow aperture width patterned positive photoresist etch mask layer. Unfortunately, substantial reductions in thickness of the blanket positive photoresist layer may yield a narrow aperture width patterned positive photoresist etch mask layer of insufficient thickness to pattern with adequate uniformity, while employing the narrow aperture width patterned positive photoresist etch mask layer, a contact or interconnection via through an insulator layer formed beneath the narrow aperture width patterned positive photoresist etch mask layer. Thus, the foregoing photoexposure energy and depth of focus difficulties present genuine problems in forming from blanket positive photoresist layers narrow aperture width patterned positive photoresist etch mask layers for use in forming narrow apertures, such as narrow contact and interconnection vias, through substrate layers, such as insulator layers, which are formed beneath those narrow aperture width patterned positive photoresist etch mask layers.

Various methods have been disclosed in the art of integrated circuit fabrication for forming patterned photoresist layers from blanket photoresist layers. For example, Koh, in U.S. Pat. No. 5,286,608 discloses a method which employs a conductive thermally oxidized titanium oxide layer as an anti-reflective coating (ARC) layer when forming a patterned photoresist layer from a blanket photoresist layer within an integrated circuit. In addition, Sardella, in U.S. Pat. No. 5,310,622, discloses a method employing: (1) a first photoresist layer of lower optical transmittance formed upon a reflective layer in an integrated circuit; and (2) a second photoresist layer of higher optical transmittance formed upon the first photoresist layer. Through the method, the bilayer of the second photoresist layer and the first photoresist layer may be patterned with enhanced dimensional uniformity due to attentuated reflectivity from the reflective layer.

It is thus desirable in the art of integrated circuit fabrication to provide a method for forming from a blanket positive photoresist layer a narrow aperture width patterned positive photoresist etch mask layer, where the narrow aperture width patterned positive photoresist etch mask layer may subsequently be employed in forming within or through a substrate layer, such as an insulator layer, formed beneath the narrow aperture width patterned positive photoresist etch mask layer a narrow aperture, such as a narrow contact or interconnection via. Particularly desirable are methods through which there may be formed from the blanket positive photoresist layer the narrow aperture width patterned positive photoresist etch mask layer while simultaneously: (1) limiting the photoexposure time in forming the narrow aperture width patterned positive photoresist etch mask layer from the blanket positive photoresist layer; and (2) compensating for the depth of focus limitation typically encountered in forming the narrow aperture width patterned positive photoresist etch mask layer from the blanket positive photoresist layer, particularly when forming exceedingly narrow apertures (ie: less than about 0.4 microns) within the narrow aperture width patterned positive photoresist etch mask layer. It is towards providing a method in accord with these goals that the present invention is directed.

SUMMARY OF THE INVENTION

A first object of the present invention is to provide a method for forming from a blanket positive photoresist layer a narrow aperture width patterned positive photoresist etch mask layer while limiting the photoexposure energy needed to form from the blanket positive photoresist layer the narrow aperture width patterned positive photoresist etch mask layer, particularly when forming exceedingly narrow apertures (ie: less than about 0.4 microns) within the narrow aperture width patterned positive photoresist etch mask layer.

A second object of the present invention is to provide a method for forming from a blanket positive photoresist layer a narrow aperture width patterned positive photoresist etch mask layer while compensating for the depth of focus limitations typically encountered in forming from the blanket positive photoresist layer the narrow aperture width patterned positive photoresist etch mask layer, also particularly when forming exceedingly narrow apertures (ie: less than about 0.4 microns) within the narrow aperture width patterned positive photoresist etch mask layer.

A third object of the present invention is to provide a method in accord with the first object of the present invention or the second object of the present invention, where the narrow aperture width patterned positive photoresist etch mask layer, once formed, may be employed in forming within or through an insulator layer formed beneath the narrow aperture width patterned positive photoresist etch mask layer a narrow aperture width aperture, such as a narrow aperture width contact or interconnection via.

A fourth object of the present invention is to provide a method in accord with the first object of the present invention, the second object of the present invention or the third object of the present invention, which method is readily manufacturable.

In accord with the objects of the present invention there is provided a method for forming from a blanket positive photoresist layer, for use within an integrated circuit, a narrow aperture width patterned positive photoresist etch mask layer. To practice the method of the present invention, there is first formed over a semiconductor substrate a reflective layer. There is then formed upon the reflective layer a blanket positive photoresist layer. The blanket positive photoresist layer is then photoexposed through a reticle to form a photoexposed blanket positive photoresist layer. Finally, the photoexposed blanket positive photoresist layer is developed to form a narrow aperture patterned positive photoresist layer. The narrow aperture patterned positive photoresist layer may then be employed as a narrow aperture width patterned positive photoresist etch mask layer in patterning a narrow aperture width patterned reflective layer from the reflective layer. In addition, at least the narrow aperture width patterned reflective layer may then be employed in patterning a narrow aperture width aperture at least partially through a substrate layer formed beneath the reflective layer. Typically, the narrow aperture width aperture will be a narrow aperture width contact or interconnection via patterned completely through an insulator layer formed beneath the reflective layer.

The present invention provides a method for forming from a blanket positive photoresist layer a narrow aperture width patterned positive photoresist etch mask layer while limiting the photoexposure energy needed to form from the blanket positive photoresist layer the narrow aperture width patterned positive photoresist etch mask layer, particularly when forming exceedingly narrow apertures (ie: less than about 0.4 microns) within the narrow aperture width patterned positive photoresist etch mask layer. By forming the blanket positive photoresist layer from which is formed the narrow aperture width patterned positive photoresist etch mask layer upon a reflective layer, the actinic light employed in photoexposing the blanket positive photoresist layer when forming the narrow aperture width patterned positive photoresist etch mask layer is reflected back into the portions of the blanket positive photoresist layer which are desired to be photoexposed. Thus, the photoexposure energy needed to form from the blanket positive photoresist layer the narrow aperture width patterned positive photoresist etch mask layer is limited, particularly when forming exceedingly narrow apertures (ie: less than about 0.4 microns) within the narrow aperture width patterned positive photoresist etch mask layer.

The present invention provides a method for forming from a blanket positive photoresist layer a narrow aperture width patterned positive photoresist etch mask layer while compensating for the depth of focus limitations typically encountered in forming from the blanket positive photoresist layer the narrow aperture width patterned positive photoresist etch mask layer, particularly when forming exceedingly narrow apertures (ie: less than about 0.4 microns) within the narrow aperture width patterned positive photoresist etch mask layer. Similarly to the method by which actinic light reflected from the reflective layer limits the photoexposure energy needed to form from the blanket positive photoresist layer the narrow aperture width patterned positive photoresist etch mask layer, the actinic light reflected from the reflective layer also compensates for the depth of focus limitations typically encountered in forming from the blanket positive photoresist layer the narrow aperture width patterned positive photoresist etch mask layer, particularly when forming exceedingly narrow apertures (ie: less than about 0.4 microns) within the narrow aperture width patterned positive photoresist etch mask layer.

Through the method of the present invention there is provided a narrow aperture width patterned positive photoresist etch mask layer which may be employed in forming within or through an insulator layer formed beneath the narrow aperture width patterned positive photoresist etch mask layer a narrow aperture width contact or interconnection via. The method of the present invention does not discriminate with respect to the nature of a substrate layer formed beneath the narrow aperture width patterned positive photoresist etch mask layer. Although it will first be necessary to pattern the reflective layer to form a narrow aperture width patterned reflective layer, the narrow aperture width patterned reflective layer, in the presence or absence of the narrow aperture width patterned positive photoresist etch mask layer, may be employed in forming a narrow aperture width contact or interconnection via through an insulator layer formed beneath the narrow aperture width patterned positive photoresist etch mask layer.

The method of the present invention is readily manufacturable. The method of the present invention provides that a reflective layer is formed beneath a blanket positive photoresist layer before the blanket positive photoresist layer is photoexposed and developed to form a patterned positive photoresist etch mask layer from the blanket positive photoresist layer. Methods and materials through which reflective layers may be formed within integrated circuits are known in the art of integrated circuit fabrication. Such methods and materials are readily adaptable to forming a reflective layer beneath a blanket positive photoresist layer such as the blanket positive photoresist layer employed within the method of the present invention. Thus, the method of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming from a blanket positive photoresist layer for use within an integrated circuit a narrow aperture width patterned positive photoresist etch mask layer. The narrow aperture width patterned positive photoresist etch mask layer may then be employed in patterning at least partially through a substrate layer, such as an insulator layer, formed beneath the narrow aperture width patterned positive photoresist etch mask layer, a narrow aperture width aperture, such as a narrow aperture width contact or interconnection via.

Through the method of the present invention, the narrow aperture width patterned positive photoresist etch mask layer is formed through photoexposure of the blanket positive photoresist layer after there has first previously been formed beneath the blanket positive photoresist layer a reflective layer. The reflective layer limits the photoexposure energy needed to form the narrow aperture width patterned positive photoresist etch mask layer from the blanket positive photoresist layer, particularly when forming exceedingly narrow apertures (ie: less than about 0.4 microns) within the narrow aperture width patterned positive photoresist etch mask layer. The reflective layer also compensates for the depth of focus limitations encountered in forming the narrow aperture width patterned positive photoresist etch mask layer from the blanket photoresist layer, also particularly when forming exceedingly narrow apertures (ie: less than about 0.4 microns) within the narrow aperture width patterned positive photoresist etch mask layer.

The method of the present invention may be employed in forming from blanket positive photoresist layers narrow aperture width patterned positive photoresist etch mask layers which may subsequently be employed in forming narrow aperture width apertures, such as narrow aperture width contact or interconnection vias, within or through substrate layers, such as insulator layers, formed beneath those blanket positive photoresist layers. In accord with the foregoing, the method of the present invention may be employed in forming from blanket positive photoresist layers narrow aperture width patterned positive photoresist etch mask layers within integrated circuits including but not limited to dynamic random access memory (DRAM) integrated circuits, static random access memory (SRAM) integrated circuits, application specific integrated circuits (ASICs), microprocessor integrated circuits, integrated circuits having within their fabrications field effect transistors (FETs), integrated circuits having within their fabrications bipolar transistors and integrated circuits having within their fabrications bipolar complementary metal oxide semiconductor (BiCMOS) transistors.

In addition, the method of the present invention may be employed in forming from blanket positive photoresist layers narrow aperture width patterned positive photoresist etch mask layers employed in forming within or through substrate layers, such as insulator layers, narrow aperture width apertures, such as narrow aperture width contact or interconnection vias, where the substrate layers are provided in various locations within an integrated circuit. For example, the method of the present invention may be employed in forming narrow aperture width contact vias through a pre-metal dielectric (PMD) insulator layer within an integrated circuit, where the pre-metal dielectric (PMD) insulator layer is formed upon a semiconductor- substrate and beneath a first conductor layer within the integrated circuit. In addition, the method of the present invention may also be employed in forming narrow aperture width interconnection vias within upper lying insulator layers within the integrated circuit, such as but not limited to inter-metal dielectric (IMD) insulator layers which are vertically further removed from the semiconductor substrate and separate upper lying horizontal patterned conductor layers within the integrated circuit. Thus, the method of the present invention has broad applicability with respect to both the types of integrated circuits within which it may be employed and to the location within the integrated circuit of an insulator layer through which a narrow aperture width contact or interconnection via may be formed through the method of the present invention.

Although the method of the present invention will typically be employed in forming from a blanket positive photoresist layer a narrow aperture width patterned positive photoresist etch mask layer to be employed in forming narrow aperture width vias, such as narrow aperture width contact and interconnection vias, through insulator layers, the method of the present invention may also be employed in forming narrow aperture width apertures at least partially through substrate layers other than insulator layers. Such substrate layers may include, but are not limited to non-reflective conductor layers, non-reflective semiconductor layers and photo-active layers.

Figure 1:
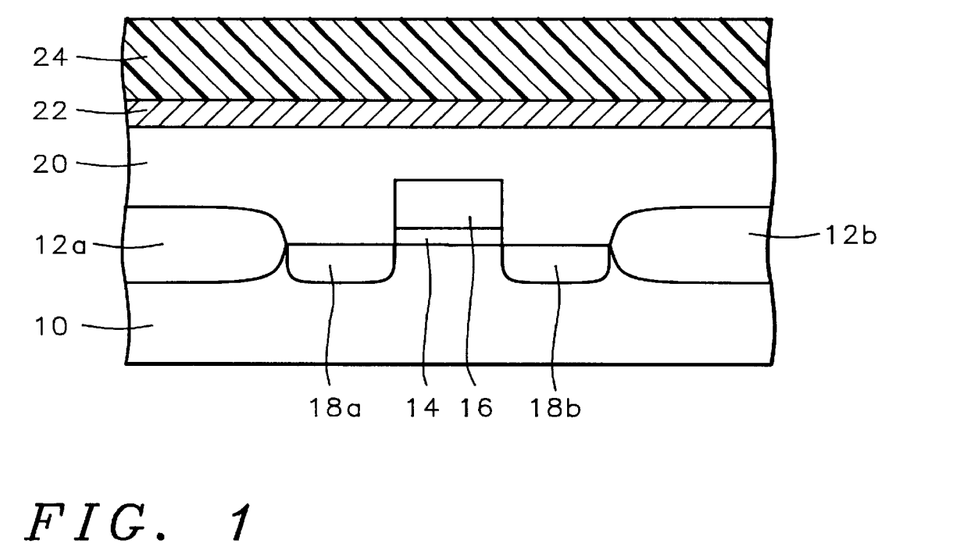
FIG. 1 to FIG. 6 show a series of schematic cross-sectional diagrams illustrating the results of progressive stages in forming within an integrated circuit multiple insulator layers having formed therethrough multiple narrow aperture width contact and interconnection vias through the preferred embodiment of the method of the present invention.

Referring now to FIG. 1 to FIG. 6, there is shown a series of schematic cross-sectional diagrams illustrating the results of progressive stages in forming within an integrated circuit multiple narrow aperture width contact and interconnection vias through multiple insulator layers through the preferred embodiment of the method of the present invention. Shown in FIG. 1 is a schematic cross-sectional diagram of the integrated circuit at its early stages of fabrication.

Shown in FIG. 1 is a semiconductor substrate 10 having formed within and upon its surface isolation regions 12a and 12b which define the active region of the semiconductor substrate 10. Although semiconductor substrates are known in the art with either dopant polarity, many dopant concentrations and various crystallographic orientations, the semiconductor substrate 10 employed within the preferred embodiment of the method of the present invention is preferably a (100) silicon semiconductor substrate having a N- or P-doping. Although it is also known in the art that isolation regions may be formed within and/or upon semiconductor substrates through several methods, including but not limited to isolation region growth methods and isolation region deposition/patterning methods, for the preferred embodiment of the method of the present invention, the isolation regions 12a and 12b are preferably formed within and upon the semiconductor substrate 10 through an isolation region growth method, where the isolation regions 12a and 12b are formed of silicon oxide through oxidation and partial consumption of the surface of the semiconductor substrate 10.

Also shown within or upon the active region of the semiconductor substrate 10, as illustrated in FIG. 1, is the presence of several structures which are employed in forming a field effect transistor (FET). The structures include: (1) a gate oxide layer 14 formed upon the active region of the semiconductor substrate 10; (2) a gate electrode 16 formed and aligned upon the gate oxide layer 14; and (3) a pair of source/drain regions 18a and 18b formed within the active region of the semiconductor substrate 10 at areas not covered by the gate oxide layer 14 and the gate electrode 16. Each of the preceding structures employed in forming the field effect transistor (FET) may be formed through methods and materials as are conventional in the art of forming field effect transistors (FETs) within integrated circuits.

For example, the gate oxide layer 14 may be formed through patterning through methods as are conventional in the art of a blanket gate oxide layer formed upon the active region of the semiconductor substrate 10 through methods including but not limited to blanket gate oxide layer thermal growth methods and blanket gate oxide layer deposition methods. Preferably, the gate oxide layer 14 so patterned is formed to a thickness of from about 100 to about 250 angstroms. In addition, the gate electrode 16 may be formed through patterning through methods as are conventional in the art of a blanket polysilicon layer formed upon tie blanket gate oxide layer through a chemical vapor deposition (CVD) method employing a suitable silicon source material, along with a suitable dopant source material. Preferably the gate electrode 16 of polysilicon so formed has a thickness of from about 1000 to about 2000 angstroms. Finally, as is common in the art, the source/drain regions 18a and 18b are preferably formed within the active region of the semiconductor substrate 10 through an ion implantation method employing a dopant of polarity suitable to the polarity of the field effect transistor (FET) desired to be formed. Typically, the ion implantation method employs the gate oxide layer 14 and the gate electrode 16 as an ion implantation mask.

There is also shown in FIG. 1 the presence of a blanket planarized pre-metal dielectric (PMD) layer 20 formed upon the surface of the semiconductor substrate 20 including the structures employed in forming the field effect transistor (FET). Methods and materials through which blanket planarized pre-metal dielectric (PMD) layers may in general be formed within integrated circuits are known in the art of integrated circuit fabrication. Blanket planarized pre-metal dielectric (PMD) layers may be formed within integrated circuit through planarizing, through methods as are conventional in the art, of conformal pre-metal dielectric (PMD) layers formed within integrated circuits. In turn, conformal pre-metal dielectric (PMD) layers may be formed within integrated circuits through methods including but not limited to chemical vapor deposition (CVD) methods, plasma enhanced chemical vapor deposition (PECVD) methods and physical vapor deposition (PVD) sputtering methods through which may be formed conformal pre-metal dielectric (PMD) layers of dielectric materials including but not limited to silicon oxide dielectric materials, silicon nitride dielectric materials, silicon oxynitride dielectric materials and composites of silicon oxide dielectric materials, silicon nitride dielectric materials and silicon oxynitride dielectric materials. For the preferred embodiment of the method of the present invention, the blanket planarized pre-metal dielectric (PMD) layer 20 is preferably formed from a two layer silicon oxide composite dielectric layer. The first layer within the two layer silicon oxide composite dielectric layer is preferably a conformal silicon oxide dielectric layer formed through a plasma enhanced chemical vapor deposition (PECVD) method. Formed then upon the first layer within the two layer silicon oxide composite dielectric layer is a second layer preferably formed from a conformal boro-phospho-silicate-glass (BPSG) silicon oxide dielectric layer deposited through a chemical vapor deposition (CVD) method. The two layer silicon oxide composite dielectric layer is then thermally annealed to form from the conformal boro-phospho-silicate glass (BPSG) silicon oxide dielectric layer a reflowed boro-phosph-silicate glass (BPSG) silicon oxide dielectric layer which provides the planarized surface to the blanket planarized pre-metal dielectric (PMD) layer 20.

There is also shown in FIG. 1 a blanket first reflective layer 22 formed upon the blanket planarized pre-metal dielectric (PMD) layer 20. Methods and materials through which reflective layers may be formed within integrated circuits are known in the art of integrated circuit fabrication. Reflective layers may be formed within integrated circuits through methods including but not limited to thermally assisted evaporation methods, electron beam assisted evaporation methods, physical vapor deposition (PVD) sputtering methods and chemical vapor deposition (CVD) methods through which may be formed reflective layers of reflective materials including but not limited to metals, metal alloys, metal nitrides, silicon nitride and polysilicon. For the preferred embodiment of the method of the present invention, the blanket first reflective layer 22 is preferably formed upon the blanket planarized pre-metal dielectric (PMD)) layer 20 from a reflective material chosen from the group of reflective materials consisting of titanium, titanium-tungsten alloy, titanium nitride, polysilicon and silicon nitride deposited through a method appropriate to the reflective material. More preferably, the blanket first reflective layer 22 is formed of polysilicon or silicon nitride. Preferably, the blanket first reflective layer 22 is formed to a thickness of from about 500 to about 1000 angstroms. Within the preferred embodiment of the present invention, the blanket first reflective layer 22 has a reflectivity greater than the reflectivity of the blanket planarized pre-metal dielectric (PMD) layer 20, while within a general embodiment of the method of the present invention, a blanket reflective layer has a reflectivity greater than the reflectivity of a substrate layer upon which is formed the blanket reflective layer.

Finally, there is shown in FIG. 1 the presence of a blanket first positive photoresist layer 24 formed upon the blanket first reflective layer 22. Methods and materials through which blanket positive photoresist layers may be formed within integrated circuits are known in the art of integrated circuit fabrication. Blanket positive photoresist layers may be formed within integrated circuits through coating through photoresist coating methods as are common in the art of positive photoresist materials including but not limited to novolak positive photoresist materials and poly-methyl-meth-acrylate (PMMA) positive photoresist materials. Since the method of the present invention is directed towards forming from a blanket positive photoresist layer a narrow aperture width patterned positive photoresist etch mask layer, under conditions where there is formed exceedingly narrow apertures (je: less than about 0.4 microns) within the narrow aperture width patterned positive photoresist etch mask layer, the method of the present invention will typically and preferably employ a poly-methyl-meth-acrylate (PMMA) positive photoresist material. The method of the present invention does not, however, preclude use of alternative positive photoresist materials. Preferably, the blanket first positive photoresist layer 24 is from about 8500 to about 10000 angstroms thick.

Figure 2:
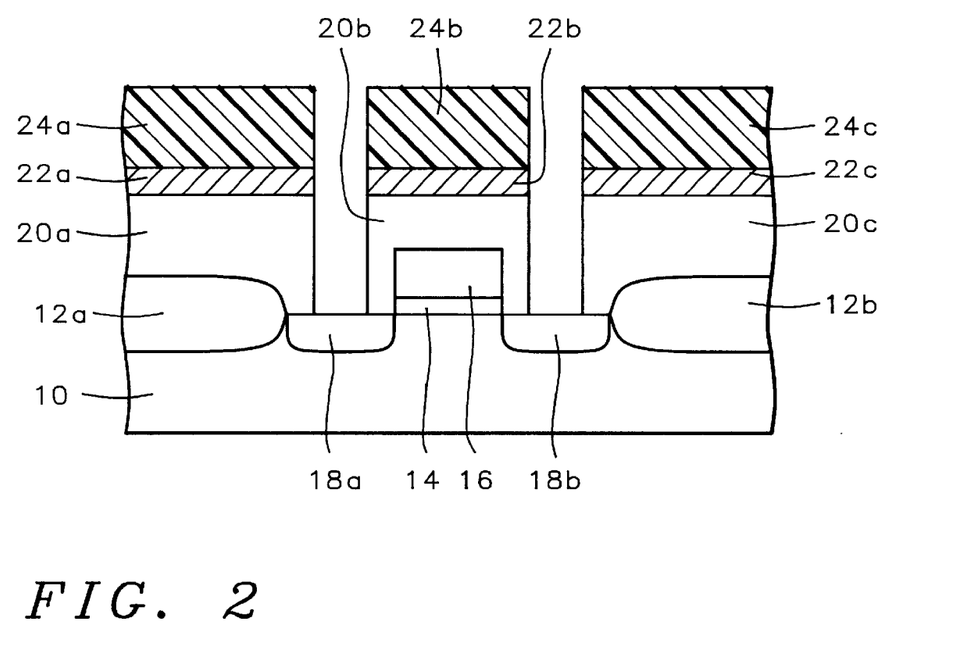

Referring now to FIG. 2, there is shown a schematic cross-sectional diagram illustrating the results of further processing of the integrated circuit whose schematic cross-sectional diagram is illustrated in FIG. 1. Shown in FIG. 2 is the results of successively patterning: (1) the blanket first positive photoresist layer 24 to form the patterned first positive photoresist layers 24a, 24b and 24c which are employed as a narrow aperture width first positive photoresist etch mask layer; (2) the blanket first reflective layer 22 to form the patterned first reflective layers 22a, 22b and 22c; and (3) the blanket planarized pre-metal dielectric (PMD) layer 20 to form the patterned planarized pre-metal dielectric (PMD) layers 20a 20b and 20c. Through this successive patterning of the blanket first positive photoresist layer 24, the blanket first reflective layer 22 and the blanket planarized pre-metal dielectric (PMD) layer 20 there is reached the surfaces of the source/drain regions 18a and 18b while simultaneously forming a pair of narrow aperture width contact vias defined by the patterned planarized pre-metal dielectric (PMD) layers 20a, 20b and 20c.

The method of the present invention provides most value in forming the pair of narrow aperture width contact vias separated by the patterned planarized pre-metal dielectric (PMD) layers 20a, 20b and 20c when each narrow aperture width contact via within the pair of narrow aperture width contact vias is desired to be formed to an aperture width of less than about 0.4 microns. Under such circumstances, the blanket first reflective layer 22 formed beneath the blanket first positive photoresist layer 24 reflects a comparatively substantial quantity of actinic light back into portions of the blanket first positive photoresist layer 24 which are desired to be photoexposed in forming the patterned first positive photoresist layers 24a; 24b and 24c from the blanket first positive photoresist layer 24. The actinic light reflected back into the blanket first positive photoresist layer 24 allows the patterned first positive photoresist layers 24a, 24b and 24c to be formed with a lower photoexposure energy than would otherwise be employed in forming the patterned first positive photoresist layers 24a, 24b and 24c absent the blanket first reflective layer 22 formed beneath the blanket first positive photoresist layer 24. The actinic light reflected back into the blanket first positive photoresist layer 24 also compensates for depth of focus limitations typically encountered in forming the patterned first positive photoresist layers 24a, 24b and 24c from the blanket first positive photoresist layer 24 when the aperture width between the patterned first positive photoresist layers 24a, 24b and 24c is less than about 0.4 microns. Following photoexposure of the blanket first positive photoresist layer 24 the photoexposed blanket first positive photoresist layer 24 is developed through methods as are conventional in the art to form the patterned first positive photoresist layers 24a, 24b and 24c. Typically, although not exclusively, a wet chemical developer method and materials are employed.

Following photoexposure and development of the blanket first positive photoresist layer 24 to form the patterned first positive photoresist layers 24a, 24b and 24c which are employed as a narrow aperture width patterned first positive photoresist etch mask layer, the blanket first reflective layer 22 is patterned to form the patterned first reflective layers 22a, 22b and 22c, and the blanket planarized pre-metal dielectric (PMD) layer 20 is patterned to form the patterned planarized pre-metal dielectric (PMD) layers 20a, 20b and 20c, typically and preferably through successive plasma etch processing methods employing etchant gas compositions appropriate to the materials from which are formed the blanket first reflective layer 22 and the blanket planarized pre-metal dielectric (PMD) layer 20.

Figure 3:
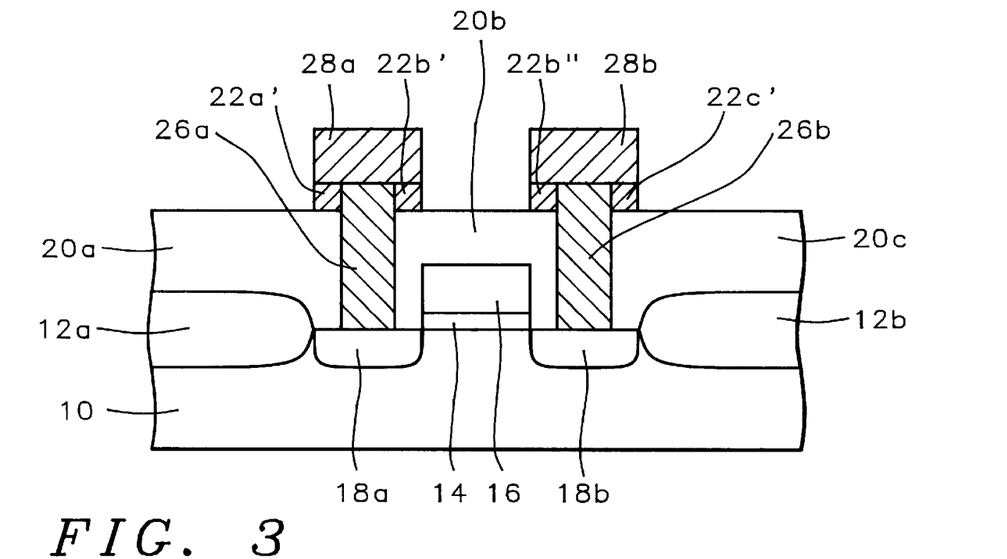

Referring now to FIG. 3, there is shown a schematic cross-sectional diagram illustrating the results of further processing of the integrated circuit whose schematic cross-sectional diagram is illustrated in FIG. 2. Shown in FIG. 3 is a schematic cross-sectional diagram of an integrated circuit otherwise equivalent to the integrated circuit whose schematic cross-sectional diagram is illustrated in FIG. 2, but from whose surface has been removed the patterned first positive photoresist layers 24a, 24b and 24c. The patterned first positive photoresist layers 24a, 24b and 24c may be removed through methods as are conventional in the art, which will typically, although not exclusively, include dry plasma photoresist stripping methods and wet chemical photoresist stripping methods.

There is also shown in FIG. 3 the presence of a pair of conductive contact studs 26a and 26b formed into the pair of narrow aperture width contact vias which are defined by the patterned planarized pre-metal dielectric (PMD) layers 20a, 20b and 20c. Methods and materials through which conductive contact studs may be formed within integrated circuits are known in the art of integrated circuit fabrication. Conductive contact studs may be formed within integrated circuits through methods including but not limited to thermally assisted evaporation methods, electron beam assisted evaporation methods, chemical vapor deposition (CVD) methods and physical vapor deposition (PVD) sputtering methods through which may be formed conductive contact studs of conductive materials including but not limited to metals, metal alloys and highly doped polysilicon. For the preferred embodiment of the method of the present invention, the pair of conductive contact studs 26a and 26b is preferably formed at least in part of tungsten metal deposited through a chemical vapor deposition (CVD) method, as is common in the art of integrated circuit fabrication. Preferably, the pair of conductive contact studs 26a and 26b is formed to a thickness sufficient to reach the upper surfaces of the patterned first reflective layers 22a, 22b and 22c, as illustrated in FIG. 2.

Finally, there is shown in FIG. 3 the presence of a pair of patterned first conductor layers 28a and 28b formed in part upon corresponding portions of the pair of conductive contact studs 26a and 26b, and further in part upon the upper surfaces of a corresponding series of patterned first reflective layers residues 22a', 22b', 22b" and 22c'. Methods and materials through which patterned conductor layers may be formed within integrated circuits are known in the art of integrated circuit fabrication. Patterned conductor layers are typically, although not exclusively, formed within integrated circuits through patterning through methods as are conventional in the art of blanket conductor layers formed within integrated circuits. Blanket conductor layers may be formed within integrated circuits through methods including but not limited to thermally assisted evaporation methods, electron beam assisted evaporation methods and physical vapor deposition (PVD) sputtering methods through which may be formed blanket conductor layers of conductor materials including but not limited to metals and metal alloys. For the preferred embodiment of the method of the present invention, the pair of patterned first conductor layers 28a and 28b is preferably formed through patterning, through a plasma etch method as is common in the art, of a blanket conductor layer formed at least in part of an aluminum containing alloy deposited through a physical vapor deposition (PVD) sputtering method, as is also common in the art.

As is understood by a person skilled in the art, the patterned first reflective layers 22a, 22b and 22c when formed of a reflective material which is also a conductor material must be further patterned to yield the patterned first reflective layer residues 22a', 22b', 22b'' and 22c', in order to avoid forming an electrical short between the pair of conductive contact studs 26a and 26b. Under circumstances where the patterned first reflective layers 22a, 22b and 22c are formed from a reflective material which is not also a conductor material, such as but not limited to a reflective undoped polysilicon material or a reflective silicon nitride material, the patterned first reflective layers 22a, 22b and 22c need not be further patterned to yield the patterned first reflective layer residues 22a', 22b', 22b'' and 22c. From a practical perspective, conductive reflective materials will often, but not exclusively, be formed from metals which are readily subsequently patterned within plasma etch methods which are preferably employed in forming the pair of patterned first conductor layers 28a and 28b. In addition, non-conductive reflective materials are typically, although not exclusively, formed from non-metals which serve as etch stop layers within plasma etch methods which are preferably employed in forming the pair of patterned first conductor layers 28a and 28b.

Figure 4:
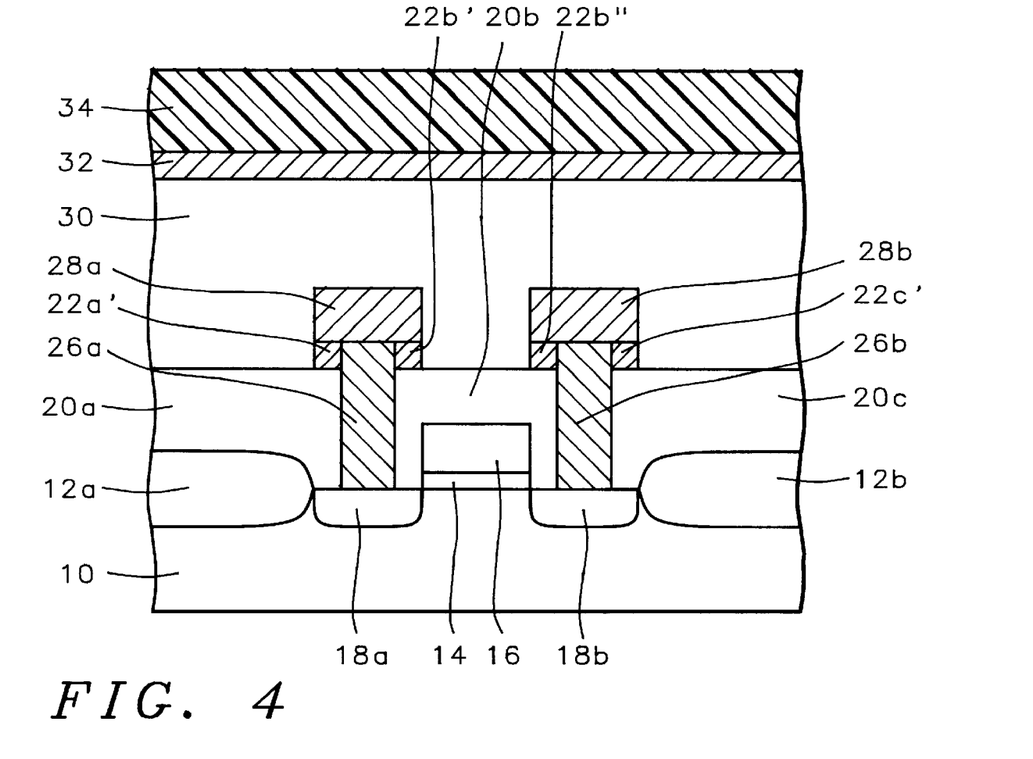
Figure 5:
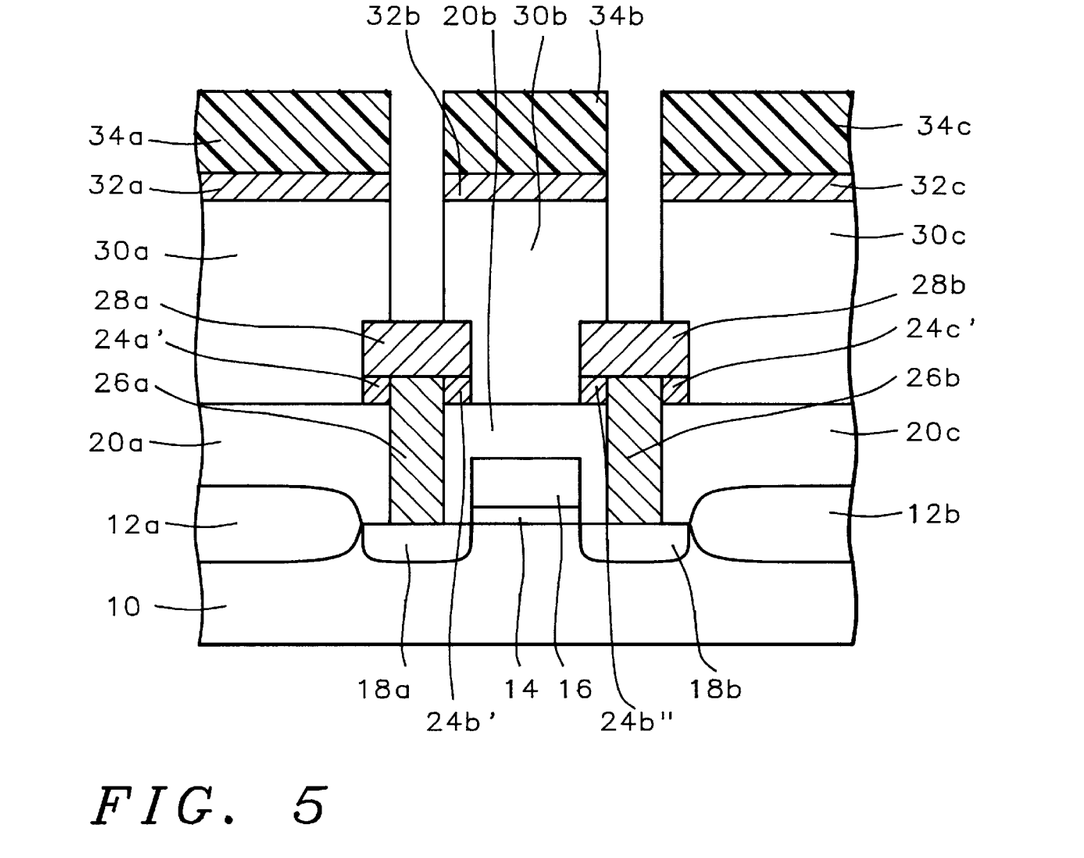
Figure 6:
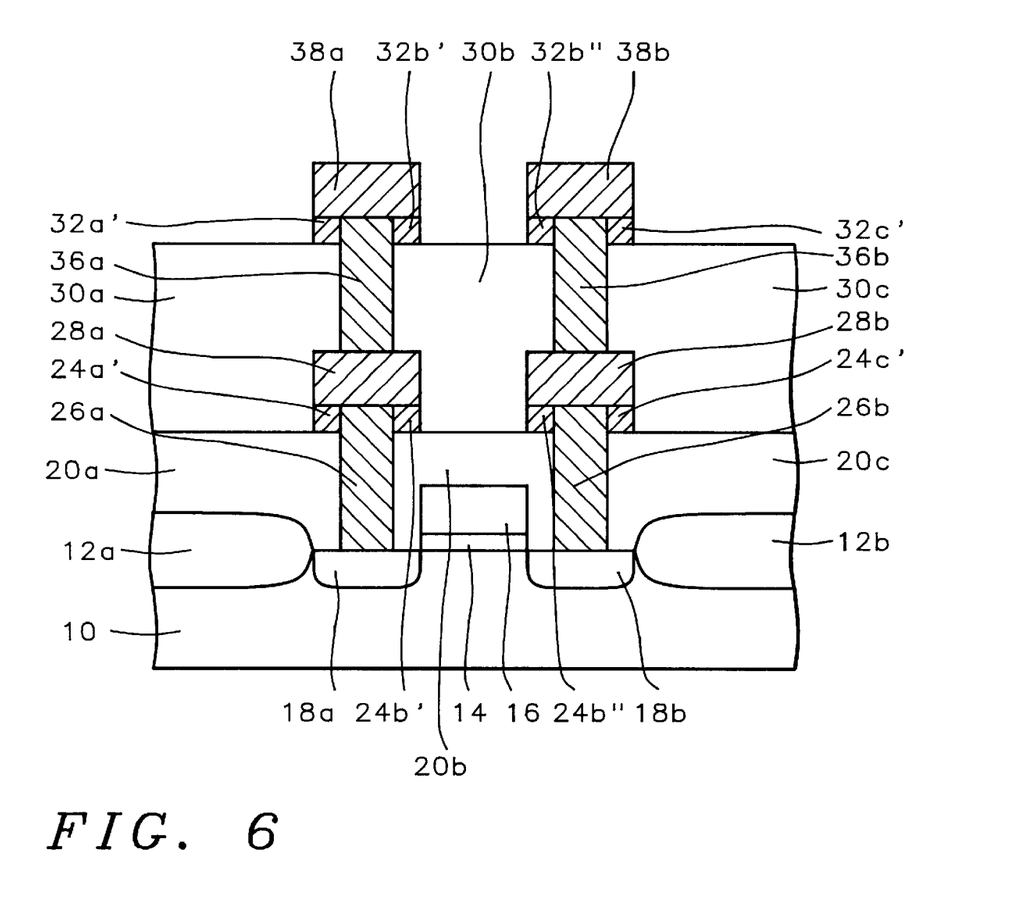

As is understood by a person skilled in the art, the method of the present invention may be employed in forming from blanket positive photoresist layers patterned positive photoresist layers which may serve as narrow aperture width patterned positive photoresist etch mask layers in forming narrow aperture width vias through insulator layers within integrated circuits other than the pre-metal dielectric (PMD) 20 layer as illustrated within FIG. 1. In that regard, there is shown in FIG. 4 to FIG. 6 a series of schematic cross-sectional diagrams illustrating the results of forming through an inter-metal dielectric (IMD) layer within the same integrated circuit as is illustrated within FIG. 1 to FIG. 3 a pair of narrow aperture width interconnection vias employing as a narrow aperture width patterned second photoresist etch mask layer a series of patterned second positive photoresist layers formed through the method of the present invention. Shown in FIG. 4 is the results of early stages in forming the pair of narrow aperture width interconnection vias through the inter-metal dielectric (IMD) layer.

Shown in FIG. 4 is a schematic cross-sectional diagram of an integrated circuit otherwise equivalent to the integrated circuit whose schematic cross-sectional diagram is illustrated in FIG. 3, but upon whose surface is formed a blanket planarized inter-metal dielectric (IMD) layer 30. Methods and materials through which blanket planarized inter-metal dielectric (IMD) layers may be formed within integrated circuit are known in the art of integrated circuit fabrication. Blanket planarized inter-metal dielectric (IMD) layers may be formed within integrated circuits through planarizing, through methods as are conventional in the art, of conformal inter-metal dielectric (IMD) layers formed within integrated circuits. Conformal inter-metal dielectric (IMD) layers may be formed within integrated circuits through methods including but not limited to chemical vapor deposition (CVD) methods, plasma enhanced chemical vapor deposition (PECVD) methods and physical vapor deposition (PVD) sputtering methods through which may be formed conformal inter-metal dielectric (IMD) layers of dielectric materials including but not limited to silicon oxide dielectric materials, silicon nitride dielectric materials, silicon oxynitride dielectric materials and composites of silicon oxide dielectric materials, silicon nitride dielectric materials and silicon oxynitride dielectric materials. Although any of the foregoing dielectric materials may be employed when forming a conformal inter-metal dielectric (IMD) layer from which is formed the blanket planarized inter-metal dielectric (IMD) layer 30, for the preferred embodiment of the method of the present invention the conformal inter-metal dielectric (IMD) layer is preferably formed from a silicon oxide dielectric material deposited through a plasma enhanced chemical vapor deposition (PECVD) method, as is common in the art. The conformal inter-metal dielectric (IMD) layer so formed is then planarized, preferably through a reactive ion etch (RIE) etchback planarizing method or chemical mechanical polish (CMP) planarizing method as is also common in the art, to form the blanket planarized inter-metal dielectric (IMD) layer 30.

Also shown in FIG. 4 is the presence of a blanket second reflective layer 32 and a blanket second positive photoresist layer 34. The blanket second reflective layer 32 is preferably formed through methods, materials and dimensions equivalent to the methods, materials and dimensions employed in forming the blanket first reflective layer 22. The blanket second positive photoresist layer 34 is preferably formed through methods, materials and dimensions equivalent to the methods, materials and dimensions employed in forming the blanket first positive photoresist layer 24.

Referring now to FIG. 5, there is show a schematic cross-sectional diagram illustrating the results of further processing of the integrated circuit whose schematic cross-sectional diagram is illustrated in FIG. 4. Shown in FIG. 5 is the results of successively patterning within the integrated circuit whose schematic cross-sectional diagram is illustrated in FIG. 4 of: (1) the blanket second positive photoresist layer 34 to form the patterned second positive photoresist layers 34a, 34b and 34c which are employed as a narrow aperture width patterned second positive photoresist etch mask layer; (2) the blanket second reflective layer 32 to form the patterned second reflective layers 32a, 32b and 32c; and (3) the blanket inter-metal dielectric (IMD) layer 30 to form the patterned inter-metal dielectric (IMD) layers 30a, 30b and 30c. The successive patterning of the blanket second positive photoresist layer 34, the blanket second reflective layer 32 and the blanket planarized inter-metal dielectric (IMD) layer 30 is preferably undertaken through methods and materials equivalent to the methods and materials employed in the corresponding successive patterning of the blanket first positive photoresist layer 24, the blanket first reflective layer 22 and the blanket planarized pre-metal dielectric (PMD) layer 20. Analogously with the patterning of the blanket first positive photoresist layer 24 to form the patterned first positive photoresist layers 24a, 24b and 24c which serve as a narrow aperture width patterned first positive photoresist etch mask layer, the patterning of the blanket second photoresist layer 34 is assisted by actinic light reflected back into the photoexposed portions of the blanket second positive photoresist layer 34 from the blanket second reflective layer 32. The reflected actinic light limits the photoexposure energy needed to adequately photoexpose the blanket second positive photoresist layer 34. In addition, the reflected actinic light also compensates for the depth of focus limitations encountered in photoexposing the blanket second positive photoresist layer 34 when forming exceedingly narrow apertures (ie: less than about 0.4 microns) within the narrow aperture width patterned second positive photoresist etch mask layer which is formed from the patterned second positive photoresist layers 34a, 34b and 34c.

Referring now to FIG. 6 there is shown a schematic cross-sectional diagram illustrating the results of further processing of the integrated circuit whose schematic cross-sectional diagram is illustrated in FIG. 5. Shown in FIG. 6 is a schematic cross-sectional diagram of an integrated circuit otherwise equivalent to the integrated circuit whose schematic cross-sectional diagram is illustrated in FIG. 5, but from whose surface has been removed the patterned second positive photoresist layers 34a, 34b and 34c. The patterned second positive photoresist layers 34a, 34b and 34c are preferably removed through methods and materials equivalent to the methods and materials employed in removing the patterned first positive photoresist layers 24a, 24b and 24c.

In addition, there is shown in FIG. 6 the presence of: (1) a pair of conductive interconnection studs 36a and 36b; (2) a pair of patterned second conductor layers 38a and 38b; and (3) a series of patterned second reflective layer residues 32a', 32b', 32b" and 32c'. For the preferred embodiment of the method of the present invention, the pair of conductive interconnection studs 36a and 36b is preferably formed through methods, materials and dimensions analogous to the methods, materials and dimensions employed in forming the pair of conductive contact studs 26a and 26b. Analogously, for the preferred embodiment of the method of the present invention, the pair of patterned second conductor layers 38a and 38b is preferably formed through methods, materials and dimensions equivalent to the methods, materials and dimensions employed in forming the pair of patterned first conductor layers 28a and 28b. Finally, for the preferred embodiment of the method of the present invention, the series of patterned second reflective layer residues 32a', 32b', 32b" and 32c' is preferably formed through equivalent methods and materials, and within the equivalent considerations, as the methods, materials and considerations employed in forming the series of patterned first reflective layer residues 22a', 22b', 22b", and 22c'.

Upon forming the pair of patterned second conductor layers 38a and 38b, and the series of patterned second reflective layer residues 32a', 32b', 32b" and 32c', there is formed an integrated circuit having formed therein multiple contact and interconnection vias through multiple insulator layers. The multiple contact and interconnection vias are formed through the method of the present invention, where a blanket reflective layer formed beneath a blanket positive photoresist layer assists in forming a narrow aperture width patterned positive photoresist etch mask layer from the blanket positive photoresist layer. The blanket reflective layer reduces the photoexposure energy needed to photoexpose the blanket positive photoresist layer. The blanket reflective layer also compensates for the depth of focus limitations encountered in photoexposing the blanket positive photoresist layer.

EXAMPLES

Upon the surfaces of three series of semiconductor substrates were formed blanket composite silicon oxide insulator layers consisting of: (1) blanket lower lying silicon oxide layers deposited through a chemical vapor deposition (CVD) method employing tetra-ethyl-ortho-silicate (TEOS) as a silicon source material, at a thickness of about 1000 angstroms; and (2) blanket upper lying boro-phospho-silicate glass (BPSG) silicon oxide layers also deposited through a chemical vapor deposition (CVD) method employing tetra-ethyl-ortho-silicate (TEOS) as a silicon source material, but with boron and phosphorus dopant source materials, at a thickness of about 20000 angstroms. Upon one of the three series of semiconductor substrates was then formed a first series of blanket reflective layers consisting of titanium nitride deposited through a physical vapor deposition (PVD) sputtering method at a thickness of about 400 angstroms. Upon a second of the three series of semiconductor substrates was then formed a second series of reflective layers consisting of titanium metal layers deposited through a physical vapor deposition (PVD) sputtering method at a thickness of about 400 angstroms each. Upon the third of the three series of semiconductor substrates there was formed no reflective layers.

The three series of semiconductor substrates were reunited and there was coated upon each semiconductor substrate within the three series of semiconductor substrates a blanket photoresist layer formed from a positive photoresist material at a thickness of about 9000 angstroms. The positive photoresist material was provided as a commercially available positive photoresist material supplied as PFi38A positive photoresist material available through Mitsumishi Chemical Co., Japan.

Each of the blanket photoresist layers upon the three series of semiconductor substrates was then photoexposed through a reticle while employing i-line (ie: 365 nm) deep ultra-violet (DUV) radiation through photoexposure methods and materials as are common in the art. The photoexposures were undertaken at a photoexposure energy which provided complete photoexposure of the blanket photoresist layers formed upon the reflective titanium nitride layer and the reflective titanium layer. The photoexposures were also undertaken through a reticle designed to provide a series of windows each with a of length 0.35 microns and a width of 0.35 microns within each of the blanket photoresist layers.

Upon completion of the photoexposures, the blanket photoresist layers were developed through an appropriate photoresist development method conventional in the art. There was then determined, through scanning electron microscope (SEM) assisted inspection, whether any photoresist residue remained within the lower portion of the windows within the blanket photoresist layers formed upon the series of semiconductor substrates which had no blanket reflective layer formed thereupon. The observed results for the inspection are tabulated in TABLE I.

TABLE I

| Example | Reflective Layer | Residue |
| --- | --- | --- |
| 1 | 400 A TiN | no |
| 2 | 400 A Ti | no |
| 3 | none | yes |

From review of the data reported within TABLE I, it is seen that the presence of a reflective layer beneath a blanket positive photoresist layer allows there to be formed with a lower exposure energy a narrow aperture width window within the blanket positive photoresist layer without forming a photoresist residue at a lower level within the window.

As is understood by a person skilled in the art, the preferred embodiment and example of the method present invention are illustrative of the method of the present invention rather than limiting of the method of the present invention. Revisions may be made to methods, materials, structures and dimensions through which are provided the preferred embodiment and examples of the method of the present invention while still providing embodiments and examples that are within the spirit and scope of the method of the present invention, as defined by the appended claims.

What is claimed is:

1. A method for forming within an integrated circuit a narrow aperture width patterned positive photoresist layer from a blanket positive photoresist layer comprising:

providing a semiconductor substrate;

forming upon the semiconductor substrate an insulator layer;

forming upon the insulator layer a blanket reflective layer which has a reflectivity greater than the insulator layer;

forming upon the blanket reflective layer a blanket positive photoresist layer;

photoexposing through a reticle the blanket positive photoresist layer to form a photoexposed blanket positive photoresist layer; and developing the photoexposed blanket positive photoresist layer to form a patterned positive photoresist layer, wherein the blanket reflective layer allows for an attenuated incident photoexposure radiation dose when photoexposing the blanket positive photoresist layer to form the photoexposed blanket positive photoresist layer.

2. The method of claim 1 wherein the blanket reflective layer also provides an increased photoexposure depth of focus when photoexposing the blanket positive photoresist layer to form the photoexposed blanket positive photoresist layer.

3. The method of claim 1 wherein the blanket reflective layer is formed from a reflective material chosen from the group of reflective materials consisting of metals, metal alloys, metal nitrides, polysilicon and silicon nitride.

4. The method of claim 1 wherein the blanket positive photoresist layer is formed from a positive photoresist material chosen from the group of positive photoresist materials consisting of novolak positive photoresist materials and poly-methyl-meth-acrylate (PMMA) positive photoresist materials.

5. The method of claim 1 wherein an aperture width of an aperture within the patterned positive photoresist layer is less than 0.4 microns.

6. A method for forming within an integrated circuit a narrow width aperture comprising:

providing a semiconductor substrate;

forming upon the semiconductor substrate a substrate layer;

forming upon the substrate layer a blanket reflective layer, the blanket reflective layer having a reflectivity greater than the substrate layer;

forming upon the blanket reflective layer a blanket positive photoresist layer;

photoexposing through a reticle the blanket positive photoresist layer to form a photoexposed blanket positive photoresist layer;

developing the photoexposed blanket positive photoresist layer to form a patterned positive photoresist etch mask layer;

etching through the patterned positive photoresist etch mask layer the reflective layer to form a patterned reflective layer; and etching through at least the patterned reflective layer the substrate layer to form an aperture at least partially through the substrate layer, wherein the blanket reflective layer allows for an attenuated photoexposure radiation dose when photoexposing the blanket positive photoresist layer to form the photoexposed blanket positive photoresist layer.

7. The method of claim 6 wherein the blanket reflective layer also provides an increased photoexposure depth of focus when photoexposing the blanket positive photoresist layer to form the photoexposed blanket positive photoresist layer.

8. The method of claim 6 wherein the substrate layer is chosen from the group of substrate layers consisting of insulator layers, non-reflective conductor layers, non-reflective semiconductor layers and photo-active layers.

9. The method of claim 6 wherein the blanket reflective layer is formed from a reflective material chosen from the group of reflective materials consisting of metals, metal alloys, metal nitrides, polysilicon and silicon nitride.

10. The method of claim 6 wherein the blanket positive photoresist layer is formed from a positive photoresist material chosen from the group of positive photoresist materials consisting of novolak positive photoresist materials and poly-methy-meth-acrylate (PMMA) positive photoresist materials.

11. The method of claim 6 wherein an aperture width of an aperture within the patterned photoresist etch mask layer is less than 0.4 microns.

12. A method for forming within an integrated circuit a narrow aperture width via through an insulator layer comprising:

providing a semiconductor substrate;

forming upon the semiconductor substrate an insulator layer;

forming upon the insulator layer a blanket reflective layer, the blanket reflective layer having a reflectivity greater than the insulator layer;

forming upon the blanket reflective layer a blanket positive photoresist layer;

photoexposing through a reticle the blanket positive photoresist layer to form a photoexposed blanket positive photoresist layer;

developing the photoexposed blanket positive photoresist layer to form a patterned positive photoresist etch mask layer;

etching through the patterned positive photoresist etch mask layer the blanket reflective layer to form a patterned reflective layer; and etching through at least the patterned reflective layer the insulator layer to form a via through the insulator layer, wherein the blanket reflective layer allows for an attenuated photoexposure radiation dose when photoexposing the blanket positive photoresist layer to form the photoexposed blanket positive photoresist layer.

13. The method of claim 12 wherein the blanket reflective layer also provides an increased photoexposure depth of focus when photoexposing the blanket positive photoresist layer to form the photoexposed blanket positive photoresist layer.

14. The method of claim 12 wherein the insulator layer is formed from an insulator material chosen from the group of insulator materials consisting of silicon oxide insulator materials, silicon nitride insulator materials, silicon oxynitride insulator materials and composites of silicon oxide insulator materials, silicon nitride insulator materials and silicon oxynitride insulator materials.

15. The method of claim 12 wherein the blanket reflective layer is formed from a reflective material chosen from the group of reflective materials consisting of metals, metal alloys, metal nitrides, polysilicon and silicon nitride.

16. The method of claim 12 wherein an aperture width of an aperture within the patterned photoresist etch mask layer is less than 0.4 microns.

* * * * *